United States Patent
Ozaki et al.

(10) Patent No.: US 7,476,970 B2
(45) Date of Patent: Jan. 13, 2009

(54) COMPOSITION FOR FORMING INSULATING FILM AND METHOD FOR FABRICATING SEMICONDUCTOR DEVICE

(75) Inventors: Shirou Ozaki, Kawasaki (JP); Yoshihiro Nakata, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 68 days.

(21) Appl. No.: 11/475,000

(22) Filed: Jun. 27, 2006

(65) Prior Publication Data

US 2007/0232058 A1    Oct. 4, 2007

(30) Foreign Application Priority Data

Mar. 30, 2006   (JP) .............................. 2006-093438

(51) Int. Cl.
  H01L 23/48   (2006.01)
  H01L 23/52   (2006.01)
  H01L 29/40   (2006.01)
(52) U.S. Cl. ................. 257/744; 257/745; 257/E21.26; 257/E21.17; 257/E21.304; 257/E21.278; 257/E21.259; 257/E23.12
(58) Field of Classification Search ................. 257/744, 257/745, 758, 411, 428, 614, 615
See application file for complete search history.

(56) References Cited

U.S. PATENT DOCUMENTS

| | | | | |
|---|---|---|---|---|
| 5,492,945 A | * | 2/1996 | Mortia et al. ............... | 523/212 |
| 5,602,060 A | * | 2/1997 | Kobayashi et al. .......... | 438/781 |
| 5,693,566 A | * | 12/1997 | Cheung ....................... | 438/428 |
| 5,789,325 A | * | 8/1998 | Chandra et al. ............. | 438/781 |
| 5,866,932 A | * | 2/1999 | Yamazaki et al. ........... | 257/347 |
| 5,949,130 A | * | 9/1999 | Fukuyama et al. .......... | 257/632 |
| 6,162,743 A | | 12/2000 | Chu et al. | |
| 2003/0089903 A1 | | 5/2003 | Nakata et al. | |

FOREIGN PATENT DOCUMENTS

EP         1 321 974 A1      6/2003

(Continued)

OTHER PUBLICATIONS

Leo J. Procopio, et al., "Dehydrogenative coupling of trialkylsilanes mediated by ruthenium phosphine complexes: catalytic synthesis of carbosilanes", Journal of the American Chemical Society (1991).

(Continued)

*Primary Examiner*—David Nhu
(74) *Attorney, Agent, or Firm*—Westerman, Hattori, Daniels & Adrian, LLP.

(57) ABSTRACT

A method for fabricating a semiconductor device utilizing the step of forming a first insulating film of a porous material over a substrate; the step of forming on the first insulating film a second insulating film containing a silicon compound containing Si—$CH_3$ bonds by 30-90%, and the step of irradiating UV radiation with the second insulating film formed on the first insulating film to cure the first insulating film. Thus, UV radiation having the wavelength which eliminates $CH_3$ groups is sufficiently absorbed by the second insulating film, whereby the first insulating film is highly strengthened with priority by the UV cure, and the first insulating film can have the film density increased without having the dielectric constant increased.

1 Claim, 8 Drawing Sheets

FOREIGN PATENT DOCUMENTS

| | | |
|---|---|---|
| EP | 1 566 416 A1 | 8/2005 |
| JP | 2000-340557 A | 12/2000 |
| JP | 2002-121530 A | 4/2002 |
| JP | 2004-247695 A | 9/2004 |

OTHER PUBLICATIONS

G. Fritz, et al., "Formation of organosilicon compounds", Zeitschrift fuer Anorganische und Allgemeine Chemie (1978).

Dietmar Seyferth, et al., "Stoichiometric and catalytic ring opening of hexaalkylcyclodisilazanes by organoalkali reagents", Organometallics (1989).

Korean Office Action dated Mar. 31, 2007, issued in corresponding Korean Application No. 9-5-2007-017958137.

* cited by examiner

COMPOSITION FOR FORMING INSULATING FILM AND METHOD FOR FABRICATING SEMICONDUCTOR DEVICE

CROSS-REFERENCE TO RELATED APPLICATIONS

This application is based upon and claims the benefit of priority from the prior Japanese Patent Application No. 2006-093438, filed on Mar. 30, 2006, the entire contents of which are incorporated herein by reference.

BACKGROUND OF THE INVENTION

The present invention relates to a composition for forming an insulating film and a method for fabricating a semiconductor device, more specifically, a method for fabricating a semiconductor device including a porous insulating film, and a composition for forming a porous insulating film.

As the integration and the density of semiconductor integrated circuits are increased, the semiconductor devices are required to have more multi-level structures. On the other hand, with the increasing integration, the interconnection pitch becomes smaller, and the interconnection delay due to increased capacitances between the interconnections is a problem.

An interconnection delay is influenced by an interconnection resistance and a capacitance between interconnections. The interconnection delay is expressed by $$T \propto CR.$$

when the interconnection resistance is expressed by R and the capacitance between interconnections is expressed by C. In this expression, when an interconnection pitch is d, an electrode area (an area of the side surfaces of the opposed interconnections) is S, a dielectric constant $\in_r$, a vacuum dielectric constant is $\in_o$, a capacitance C between the interconnections is expressed by $$C = \in_o \in_r S/d.$$

Accordingly, to decrease the interconnection delay it is effective means to lower the dielectric constant of the insulating film.

Conventionally, as insulating materials, inorganic films as of silicon dioxide ($SiO_2$), silicon nitride (SiN), phospho-silicate glass (PSG), etc., and organic polymers, such as polyimide, etc., have been used. However, the dielectric constant of the CVD-$SiO_2$ film, which is most used in the semiconductor devices is about 4. SiOF film, which is being studied as a low dielectric constant CVD film, has a dielectric constant of about 3.3-3.5 but is so hygroscopic that it absorbs humidity to increase the dielectric constant.

Recently, porous insulating film is noted as an insulating material of further lower dielectric constant. The porous insulating film is made porous by adding organic resin, etc. which are evaporated or decomposed to a material for forming a film having a low dielectric constant, and evaporating or decomposing the organic resin by heat for forming the film.

The related arts are disclosed in, e.g., Reference 1 (Japanese published unexamined patent application No. 2000-340557) and Reference 2 (Japanese published unexamined patent application No. 2004-247695).

However, the porous insulating film presently has a pore size as large as not less than 10 nm, and when the pores are increased so as to decrease the dielectric constant, the dielectric constant increase and the film strength decrease take place due to the humidity absorption. Resultantly, cracks are often formed in the insulating film, and the insulating film is often broken in bonding.

SUMMARY OF THE INVENTION

An object of the present invention is to provide a method for fabricating a semiconductor device including a porous insulating film of low dielectric constant and high mechanical strength, and a composition for forming an insulating film suitable to form the porous insulating film.

According to one aspect of the present invention, there is provided a composition for forming an insulating film comprising: a silicon compound containing Si—$CH_3$ bonds by 30-90%; and an organic solvent for dissolving the silicon compound.

According to another aspect of the present invention, there is provided a method for fabricating a semiconductor device comprising the steps of: forming a first insulating film of a porous material over a substrate; forming over the first insulating film a second insulation film containing a silicon compound containing Si—$CH_3$ bonds by 30-90%; and irradiating UV radiation to the with the second insulating film formed on the first insulating film to cure the first insulating film.

According to the present invention, an insulating film containing a silicon compound containing $SiCH_3$ bonds by 30-90% is formed over a porous insulating film, and UV radiation is irradiated through the insulating film to cure the porous insulating film, whereby UV radiation having the wavelength which eliminates $CH_3$ groups is sufficiently absorbed by the upper insulating film, whereby the porous insulating film is highly strengthened with priority by the UV cure, and the porous insulating film can have the film density increased without having the dielectric constant increased. The adhesion to the lower film can be also increased. When the UV radiation is irradiated, the $CH_3$ group of the upper insulating film is eliminated, and the film density is increased, whereby the film strength is increased, and the upper insulating film can be used as the etching stopper film. Thus, a high-speed circuit substrate of higher reliability can be fabricated.

DETAILED DESCRIPTION OF THE INVENTION

A composition for forming an insulating film, a semiconductor device and the method for fabricating the same according to one embodiment of the present invention will be explained with reference to FIGS. 1 to 8.

Figure 1:
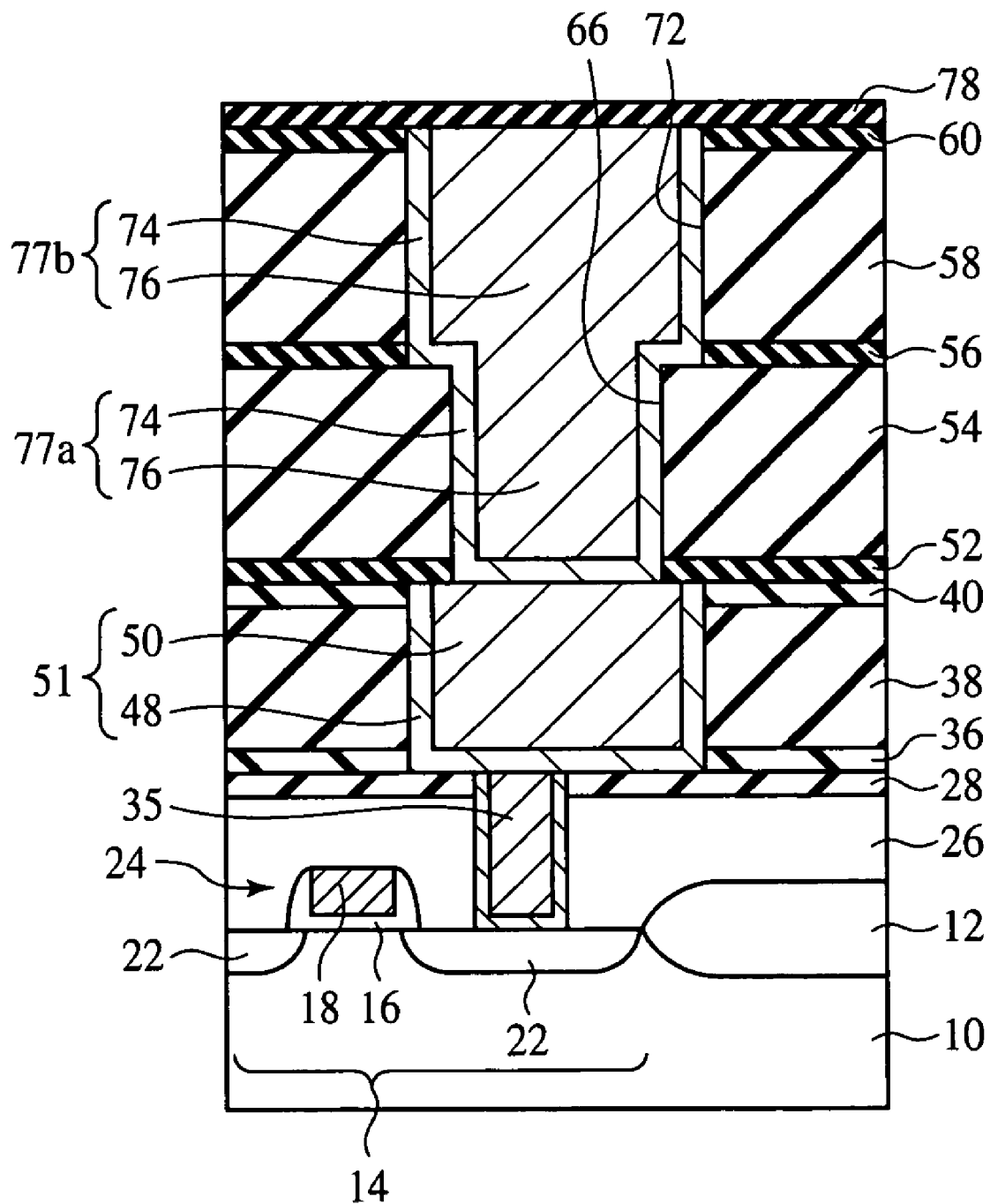
FIG. 1 is a diagrammatic sectional view of the semiconductor device according to one embodiment of the present invention, which shows a structure thereof.

FIG. 1 is a diagrammatic sectional view of the semiconductor device according to the present embodiment, which shows a structure thereof. FIGS. 2A to 8 are sectional views of the semiconductor device according to the present embodiment in the steps of the method for fabricating the same.

First, the composition for forming the insulating film according to the present embodiment will be explained.

The composition for forming the insulating film according to the present embodiment is characterized in that the composition includes a silicon compound containing Si—$CH_3$ bonds by 30-90%. Containing Si—$CH_3$ bonds by 30-90% means here that when all the bonds to Si in the compound is 100%, the content ratio of the Si—$CH_3$ bonds is 30-90%. The content ratio of the bonds can be confirmed by separating Si-2p waveform given by, e.g., XPS measurement. The inventors of the present application confirmed the content ratio of the Si—$CH_3$ bonds with an XPS apparatus of "Axis-Hsi" from Kratos Analytical Limited.

As long as the silicon compound forming the composition for forming the insulating film contains Si—$CH_3$ bonds by 30-90%, the content ratio of the silicon compound is not strictly limited. Such silicon compound can be a compound having parts of $R^1$ and $R^2$ of polycarbosilane expressed by the general formula:

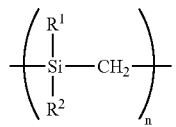

(where $R^1$ and $R^2$ may be equal to each other or different from each other and respectively represent a hydrogen atom, a substituted or an unsubstituted alkyl group, an alkenyl group, a cycloalkyl group or an aryl group.)

substituted with $CH_3$ to thereby control the content ratio of the Si—$CH_3$ bonds to be in the above-described range, or a compound having parts of $R^1$, $R^2$ and $R^3$ of polysilazane expressed by the general formula:

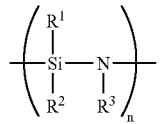

(where $R^1$, $R^2$ and $R^3$ may be equal to each other or different from each other and respectively represent a hydrogen atom, a substituted or an unsubstituted alkyl group, an alkenyl group, a cycloalkyl group or an aryl group.)

substituted with $CH_3$ to thereby control the content ratio of the Si—$CH_3$ bonds to be in the above-described range.

The composition for forming the insulating film according to the present embodiment can be used in forming insulating film for the purpose of highly strengthening porous insulating film. Specifically, an insulating film is formed by using the composition for forming the insulating film according to the present embodiment over a porous insulating film, and the porous insulating film is made highly strengthen by UV cure.

With an insulating film formed of the composition for forming the insulating film according to the present embodiment on a porous insulating film, UV cure is made, whereby UV radiation of a wavelength range effective to cut the $CH_3$ groups can be sufficiently absorbed by the upper insulating film, whereby with the low dielectric constant of the lower porous insulating film maintained, the strengthening of the porous insulating film by forming siloxane bonds can be advanced with priority. The $CH_3$ groups are intentionally cut in the upper insulating film, whereby the silicon compound can be further densified, and the upper insulating film can function as an etching stopper.

The content ratio of the Si—$CH_3$ bonds is not less than 30%, because when the content ratio is less than 30%, the UV absorption of the upper insulating film in the UV cure is insufficient, and it is difficult to suppress the dielectric constant increase of the porous insulating film. When the content ratio of the Si—$CH_3$ bonds is not more than 90%, oppositely the UV absorption is too high in the UV cure to advance the cure of the porous insulating film, and the porous insulating film cannot have a target value of the film strength.

The content ratio of the Si—$CH_3$ bonds is set in the range of 30-90%, preferably in the range of 40-70%, more preferably in the range of 50-60%. This is because as the content ratio of the Si—$CH_3$ bonds is higher, the effect of decreasing the dielectric constant of the porous insulating film and the effect of increasing the etching selectivity to the porous insulating film can be enhanced, but as the content ratio of the Si—$CH_3$ bonds is higher, it is more difficult to prepare the materials.

The process for substituting at least one of $R^1$-$R^3$ of the polycarbosilane expressed by the above-described structural formula and polysilzane expressed by the above-described structural formula is substituted by $CH_3$ groups is not specifically limited. For example, at least one of $R^1$-$R^3$ is halogenated and reacted with a Grignard reagent containing $CH_3$ groups for the substitution.

The ingredients of the composition for forming the insulating film other than the silicon compound containing Si—$CH_3$ bonds by 30-90% are not especially limited as long as the effects of the present invention are not impaired and can be suitably selected corresponding to ends. For example, solvent and various known additives can be selected.

The solvent is not especially limited and can be suitably selected corresponding to ends. For example, the solvent can be ethanol, cyclohexane, methyl isobutyl ketone, methyl ethyl ketone, methyl cellosolve, ethyl cellosolve, octane, decane, propylene glycol, propylene glycol monopropyl ether, propylene glycol monomethyl ether, propylene glycol monomethyl ether acetate, etc. The content of the solvent contained in the application solution after prepared is about 1-50 wt %.

Then, one example of the semiconductor devices using the composition for forming the insulating film described above will be explained with reference to FIG. 1.

A device isolation film 12 for defining device regions 14 is formed on a semiconductor substrate 10. In the device region 14, a MOS transistor 24 comprising a gate electrode 18 formed over the semiconductor substrate 10 with a gate insulating film 16 interposed therebetween, and source/drain regions 22 formed in the semiconductor substrate 10 on both sides of the gate electrode 14 is formed.

Over the semiconductor substrate 10 with the MOS transistor 24 formed on, an inter-layer insulating film 26 and a stopper film 28 are formed. In the inter-layer insulating film 26 and the stopper film 28, a contact plug 35 connected to the source/drain region 22 is buried.

Over the stopper film 28 with the contact plug 35 buried in, an insulating film 36, an inter-layer insulating film 38 and an insulating film 40 are formed. The inter-layer insulating film 38 is formed of a porous material of a low dielectric constant. In the insulating film 36, the inter-layer insulating film 38 and the insulating film 40, an interconnection 51 of a barrier metal 48 and a Cu film 50 is buried in.

Over the insulating film 40 with the interconnection 51 buried in, an insulating film 52, an inter-layer insulating film 54, an insulating film 56, an inter-layer insulating film 58 and an insulating film 60 are formed. The inter-layer insulating films 54, 58 are formed of a porous material of a low dielectric constant. A via hole 66 is formed in the insulating film 52 and the inter-layer insulating film 54 down to the interconnection 51. In the insulating film 56, the inter-layer insulating film 58 and the insulating film 60, an interconnection trench 72 connected to the via hole 88 is formed. In the via hole 66, a contact plug 77a of a barrier metal 74 and a Cu film 76 is buried in. In the interconnection trench 72, an interconnection 77b of a barrier film 74 and a Cu film 76 is buried in. The contact plug 77a and the interconnection 77b are formed integral with each other.

Over the insulating film 60 with the interconnection 77b buried in, an insulating film 78 is formed.

In the semiconductor device according to the present embodiment shown in FIG. 1, the insulating films 40, 56, 60 formed over the inter-layer insulating films 38, 54, 58 of a porous material are formed of the above-described composition for forming the insulating film.

Then, the method for fabricating the semiconductor device using the above-described composition for forming the insulating film will be explained with reference to FIGS. 2A to 8.

First, on the semiconductor substrate 10 of, e.g., silicon substrate, the device isolation film 12 for defining the device region 14 is formed by, e.g., LOCOS (LOCal Oxidation of silicon) method. The device isolation film 12 may be formed by STI (Shallow Trench Isolation).

Figure 2A:
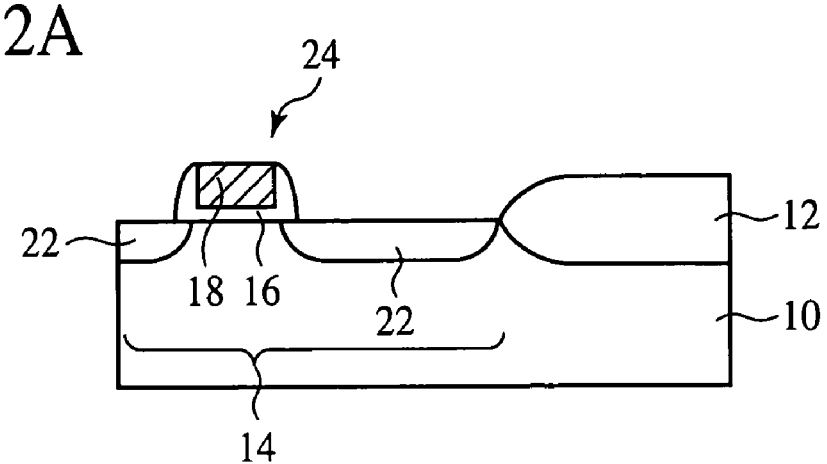
FIGS. 2A-2C, 3A-3C, 4A-4B, 5A-5B, 6, 7 and 8 are sectional views of the semiconductor device according to the embodiment of the present invention in the steps of the method for fabricating the semiconductor device.

Then, in the device region, in the same way as in the usual MOS transistor fabricating method, the MOS transistor 24 including the gate electrode 18 formed over the semiconductor substrate 10 with the gate insulating film 16 interposed therebetween, and the source/drain regions 22 formed in the semiconductor substrate 10 on both sides of the gate electrode 18 is formed (FIG. 2A).

Next, over the semiconductor substrate 10 with the MOS transistors 24 formed on, a silicon oxide film ($SiO_2$), for example, is formed by, e.g., CVD method.

Then, the surface of the silicon oxide film is polished flat by, e.g., CMP (Chemical Mechanical Polishing) method to form the inter-layer insulating film 26 of the silicon oxide film having the surface planarized.

Next, on the inter-layer insulating film 26, a silicon nitride (SiN) film of, e.g., a 50 nm-thickness is deposited by, e.g., plasma CVD method to form the stopper film 28 of the silicon nitride film. The stopper film 28 functions in later steps as the polishing stopper for CMP and as the etching stopper for forming the interconnection trench 46 in the inter-layer insulating film 38, etc.

The stopper film 28 can be, other than silicon nitride film, SiC hydride film (SiC:H film), SiC hydride oxide film (SiC:O:H film), SiC nitride film (SiC:N film) or others. The SiC:H film is SiC film with hydrogen (H) present therein. SiC:O:H film is SiC film with oxygen (O) and H (hydrogen) present therein. SiC:N film is SiC film with N (nitrogen) present therein.

Figure 2B:
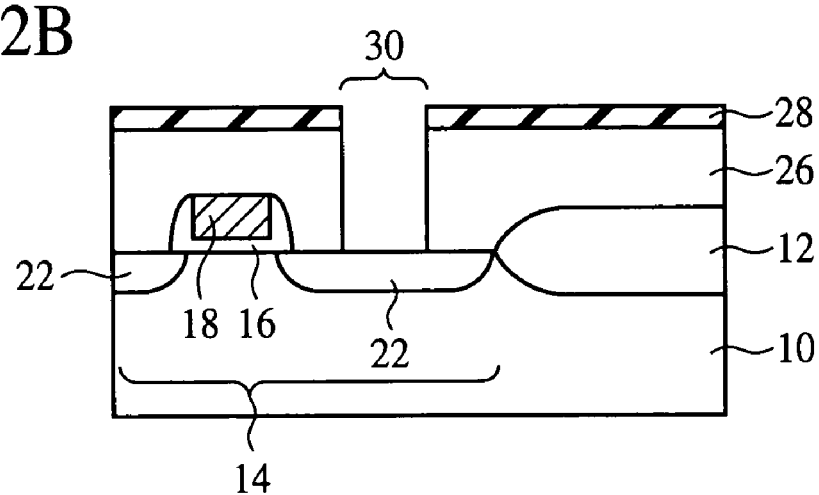
Figure 2C:
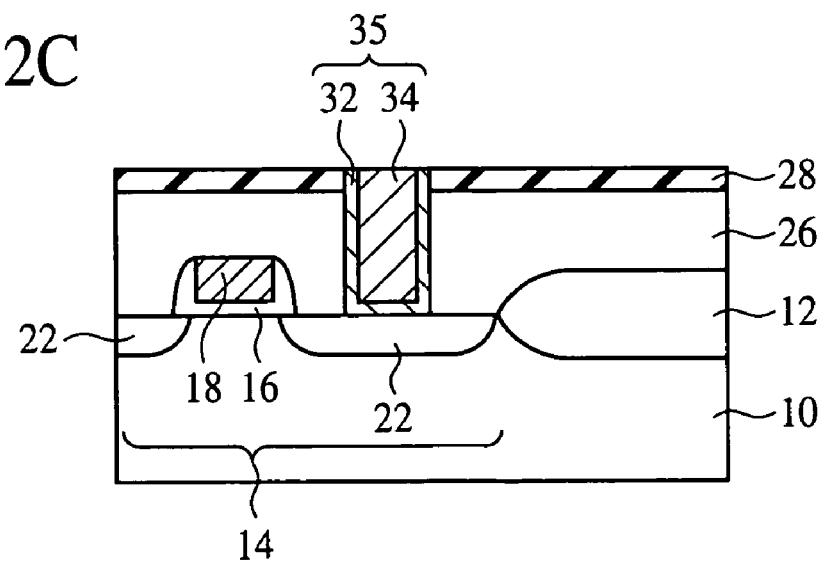

Then, a contact hole 30 is formed in the stopper film 28 and the inter-layer insulating film 26 down to the source/drain region 22 by photolithography and dry etching (FIG. 2B).

Next, a titanium nitride (TiN) film of, e.g., a 50 nm-thickness is deposited on the entire surface by, e.g., sputtering method to form the barrier metal 32 of the TiN film.

Next, on the barrier metal 32, a tungsten (W) film 34 of, e.g., 1 μm-thickness is formed by, e.g., CVD method.

Next, the tungsten film 34 and the barrier metal 32 are polished by, e.g., CMP method until the surface of the stopper film 28 is exposed to form the contact plug 35 of the barrier metal 32 and the tungsten film 34 buried in the contact hole 30.

Next, on the stopper film 28 with the contact plug 35 buried in, an SiC hydride oxide (SiC:O:H), for example, is deposited by, e.g., plasma CVD method to form the insulating film 36 of the SiC hydride oxide film. The SiC hydride oxide film is a highly dense film with oxygen (O) and H (hydrogen) present therein and functions as a barrier film for preventing the diffusion of water, etc.

Figure 3A:
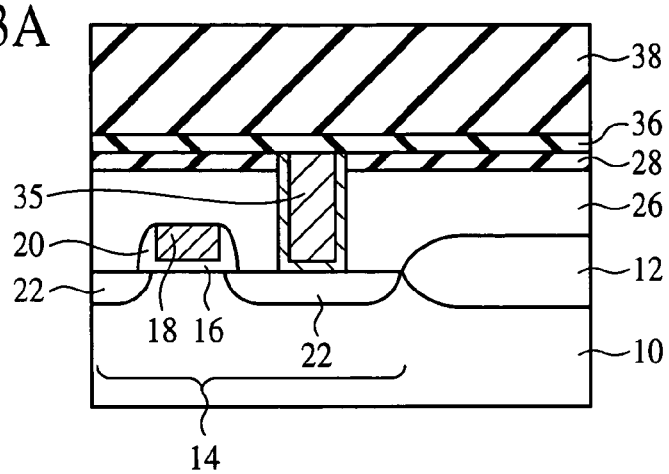

Then, on the insulating film 36, the inter-layer insulating film 38 of a porous material, e.g., porous silica of, e.g., a 160 nm-thickness is formed (FIG. 3A). The porous material forming the inter-layer insulating film 38 is not especially limited as long as the material has pores. The porous material can be carbon-added silicon oxide film formed by vapor phase growth method, carbon added porous silicon oxide film having pores formed by adding a heat decomposable compound to the carbon added silicon oxide film, porous silica formed by spin coating method, an organic porous film or others. In terms of controlling the pores and density, porous silica formed by spin coating method is most preferable.

The inter-layer insulating film 38 of porous silica is formed as exemplified below. First, the liquid of the composition for forming the porous inter-layer insulating film 38 is applied to the insulating film 36 by, e.g., spin coating method to form an applied film of the composition for forming the insulating film. The conditions for the application are, e.g., 3000 rpm and 30 seconds. Next, thermal processing (soft bake) is made to semi-cure the applied film while thermally decomposing the heat decomposable compound contained in the composition for forming the insulating film to form pores. Thus, the inter-layer insulating film 38 of porous silica is formed.

In the soft bake, it is preferable to control the processing temperature and the processing period of time so that the cross-linking degree measured by infrared spectroscopy is 10-90%. When the cross-linking degree is above 90%, the photochemical reaction by UV cure which will be made in a later step is not smoothly advanced. When the cross-linking degree is less than 10%, undesirably, the insulating film therebelow is dissolved by the application solvent.

The composition for forming the porous silica can be formed by adding a heat decomposable organic compound to a polymer prepared by hydrolysis reaction or condensation polymerization reaction using as the raw material, e.g., tetraalkoxysilane, trialkoxysilane, methyl trialkoxysilane, ethyl trialkoxysilane, propyl trialkoxysilane, phenyl trialkoxysilane, vinyl trialkoxysilane, allyl trialkoxysilane, glycidyl trialkoxysilane, dialkoxysilane, dimethyl dialkoxysilane, diethyl dialkoxysilane, dipropyl dialkoxysilane, diphenyl dialkoxysilane, divinyl dialkoxysilane, diallyl dialkoxysilane, diglycidyl dialkoxysilane, phenyl methyl dialkoxysilane, phenyl ethyl dialkoxysilane, phenyl propyl trialkoxysilane, phenyl vinyl dialkoxysilane, phenyl allyl dialkoxysilane, phenyl glycidyl dialkoxysilane, methyl vinyl dialkoxysilane, ethyl vinyl dialkoxysilane, propyl vinyl dialkoxysilane or others. Preferably, the composition for forming the insulating film is cluster porous silica formed of quaternary alkylamine. This is because small-sized pores can be uniformly formed. The organic compound for the heat decomposition can be, e.g., acryl resin or others.

Figure 3B:
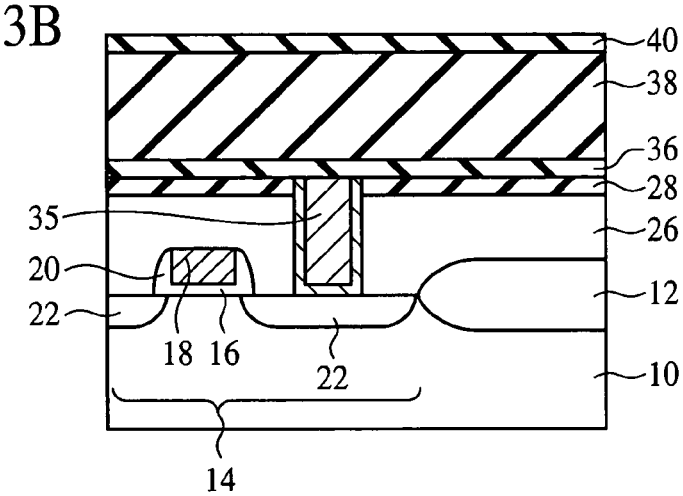

Then, on the inter-layer insulating film 38, the insulating film 40 of a silicon compound containing Si—$CH_3$ bonds by 30-90% is formed (FIG. 3B). Here, containing Si—$CH_3$ bonds by 30-90% means that all the bonds to Si in the compound is 100%, the content of the Si—$CH_3$ bonds is 30-90%. The content ratio of the bonds can be confirmed by separating Si-2p waveform given by, e.g., XPS measurement. The inventors of the present application confirmed the content ratio of the Si—$CH_3$ bonds with an XPS apparatus of "Axis-Hsi" from Kratos Analytical Limited.

As long as the silicon compound forming the composition for forming the insulating film contains Si—$CH_3$ bonds by 30-90%, the content ratio of the silicon compound is not strictly limited. Such silicon compound can be a compound having parts of $R^1$ and $R^2$ of polycarbosilane expressed by the general formula:

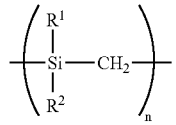

(where $R^1$ and $R^2$ may be equal to each other or different from each other and respectively represent a hydrogen atom, a substituted or an unsubstituted alkyl group, an alkenyl group, a cycloalkyl group or an aryl group.)

substituted with $CH_3$ to thereby control the content ratio of the Si—$CH_3$ bonds to be in the above-described range, or a compound having parts of $R^1$, $R^2$ and $R^3$ of polysilazane expressed by the general formula:

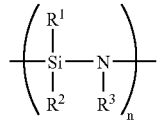

(where $R^1$, $R^2$ and $R^3$ may be equal to each other or different from each other and respectively represent a hydrogen atom, a substituted or an unsubstituted alkyl group, an alkenyl group, a cycloalkyl group or an aryl group.)

substituted with $CH_3$ to thereby control the content ratio of the Si—$CH_3$ bonds to be in the above-described range.

The content ratio of the Si—$CH_3$ bonds is not less than 30%, because when the content ratio is less than 30%, the UV absorption of the insulating film 40 in the UV cure to be made in a step which will be described after is insufficient, and it is difficult to suppress the dielectric constant increase of the porous insulating film 38. When the content ratio of the Si—$CH_3$ bonds is not more than 90%, oppositely the UV absorption is too high in the UV cure to advance the cure of the porous insulating film, and the porous insulating film cannot have a target value of the film strength.

The insulating film 40 is formed as exemplified below. First, the liquid of the composition for forming the insulating film 40 is applied to the insulating film 36 by, e.g., spin coating method to form an applied film of the composition for forming the insulating film. Then, thermal processing (soft bake) is made to semi-cure the applied film to form the insulating film 40.

Figure 3C:
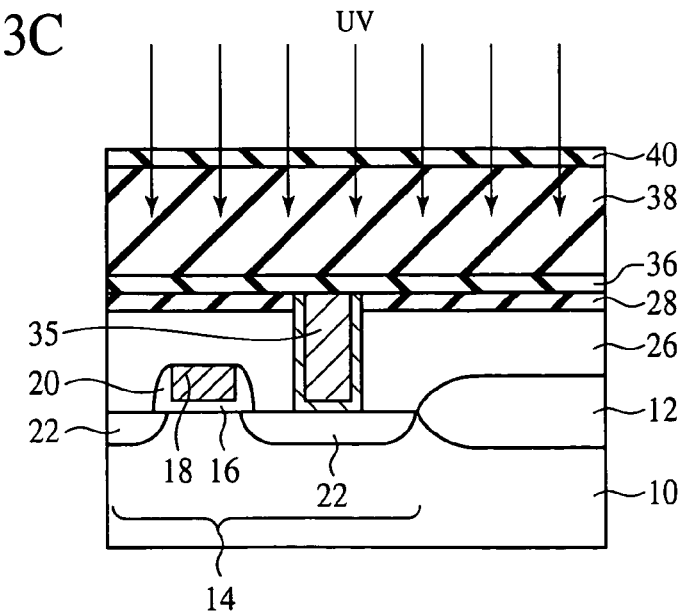

Then, UV radiation is irradiated, through the insulating film 40, to the inter-layer insulating film 38 to UV cure the inter-layer insulating film 38 (FIG. 3C). The UV cure may be made in vacuum or under the normal pressure, but preferably the UV cure is made in vacuum. For the UV cure in vacuum, an inert gas, such as nitrogen, argon or others, may be introduced for the pressure adjustment and reforming. In irradiating the UV radiation, it is preferable to apply the UV radiation while being heated at 50-470° C. This is because the cure of the porous inter-layer insulating film 38 is accelerated, the film strength can be increased and the adhesion to the lower insulating film (the stopper film 28) can be increased. The temperature of the thermal processing may be constant or changed in a plurality of steps.

In the UV cure, because of the insulating film 40 of the silicon compound containing Si—$CH_3$ bonds by 30-90% formed on the inter-layer insulating film 38, part of the UV radiation having the wavelength range which eliminates $CH_3$ groups is absorbed by the insulating film 40 to allow only the UV radiation necessary to dehydrate and condense silanol groups remaining in the inter-layer insulating film 38 to arrive at the inter-layer insulating film 38. Thus, the elimination of the $CH_3$ groups suppresses the increase of the dielectric constant while, the film strength of the inter-layer insulating film 38 can be increased.

The UV cure eliminates the $CH_3$ groups in the insulating film 40 resultantly to make the insulating film 40 highly dense. Thus, the insulating film 40 can function as the etching stopper. The content of the Si—$CH_3$ bonds in the insulating film 40 after the UV cure was measured, and all the samples had values which do not exceed 10%.

Then, a photoresist film 42 with an opening 44 exposing a region for the interconnection of the first layer to be formed in is formed over the insulating film 40 by photolithography.

Figure 4A:
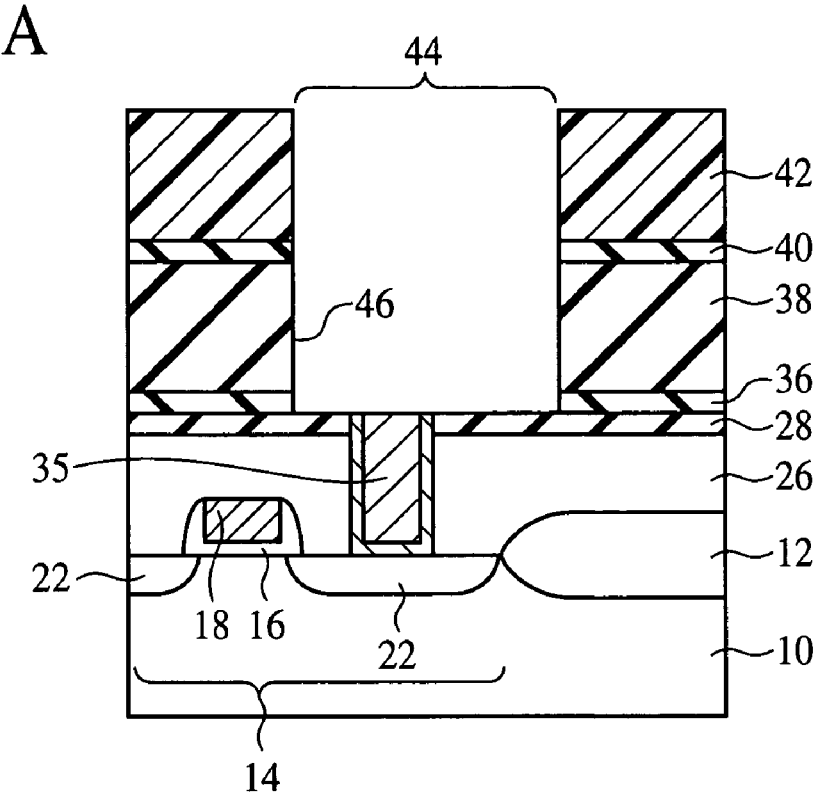

Then, by dry etching using, e.g., $CF_4$ gas and $CHF_3$ gas, the insulating film 40, the inter-layer insulating film 38 and the insulating film 36 are sequentially etched with the photoresist film 42 as the mask and the stopper film 28 as the stopper to form an interconnection trench 46 for burying the interconnection 52 in the insulating film 40, the inter-layer insulating film 38 and the insulating film 36 (FIG. 4A). The upper surface of the contact plug 35 is exposed in the interconnection trench 46.

Next, the photoresist film 42 is removed by, e.g., ashing.

Next, a tantalum nitride (TaN) film of, e.g., a 10 nm-thickness is deposited over the entire surface by, e.g., sputtering method to form the barrier metal 48 of the TaN film. The barrier metal 48 is for preventing the diffusion of Cu into the insulating film from a copper interconnection to be formed in a later step.

Next, a Cu film of, e.g., a 10 nm-thickness is deposited on the barrier metal 48 by, e.g., sputtering method to form a seed film (not shown) of the Cu film.

Next, by, e.g., electroplating method with the seed film as the seed, a Cu film is deposited to form a Cu film 50 of a 600 nm-thickness including the thickness of the seed layer.

Next, the Cu film 50 and the barrier metal 48 on the insulating film 40 are removed by CMP method to form the interconnection 51 of the barrier metal 48 and the Cu film 50 buried in the interconnection trench 46. The process for forming the interconnection 51 is called single damascene method.

Figure 4B:
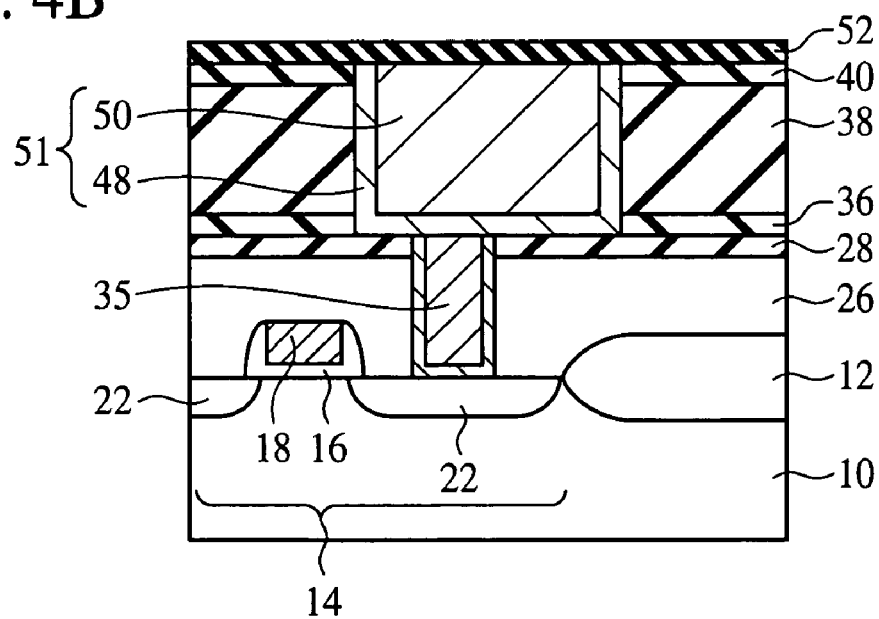

Then, an SiC hydride oxide film of, e.g., a 30 nm-thickness is deposited on the entire surface by, e.g., CVD method to form the insulating film 52 of the SiC hydride oxide film (FIG. 4B). The insulating film 52 functions as a barrier film for preventing the diffusion of water and the diffusion of the Cu from the Cu interconnection.

Next, the porous inter-layer insulating film 54 is formed on the insulating film 52. The porous inter-layer insulating film 54 is formed by the same process for forming, e.g., the inter-layer insulating film 38 described above. The film thickness of the inter-layer insulating film 54 is, e.g., 180 nm.

Figure 5A:
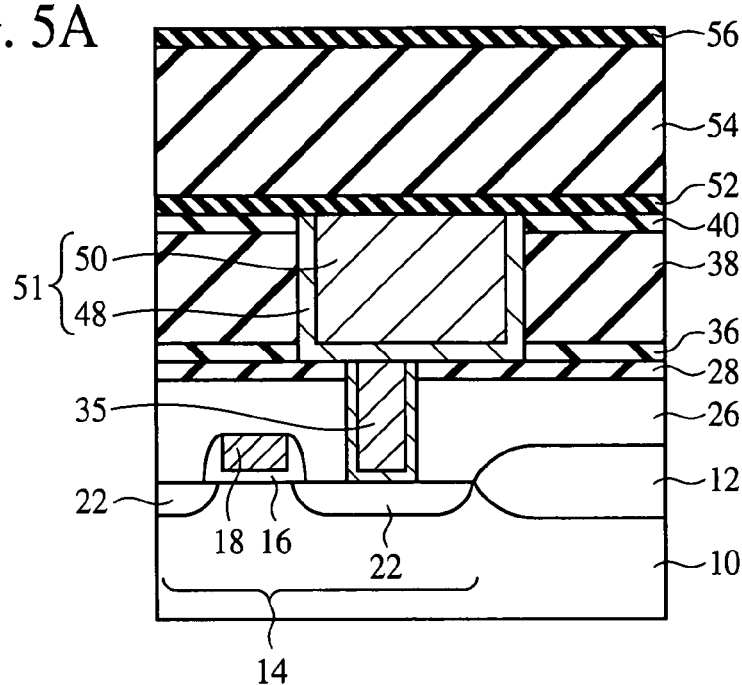

Next, on the inter-layer insulating film 54, the insulating film 56 of a silicon compound containing Si—$CH_3$ bonds by 30-90% is formed (FIG. 5A). The insulating film 56 is formed by the same process for forming the insulating film 40 described above. The film thickness of the insulating film 56 is, e.g., 30 nm.

Next, UV radiation is irradiated through the insulating film 56 to the inter-layer insulating film 54 to UV cure the inter-layer insulating film 54. The UV cure is for increasing the film strength of the porous inter-layer insulating film 54 and increasing the film density of the insulating film 56 and is made in the same way as the UV cure for forming the inter-layer insulating film 38 described above.

Then, the porous inter-layer insulating film 58 is formed on the insulating film 56. The porous inter-layer insulating film 58 is formed by the same process for forming, e.g., the inter-layer insulating film 38 described above. The film thickness of the inter-layer insulating film 59 is, e.g., 160 nm.

Figure 5B:
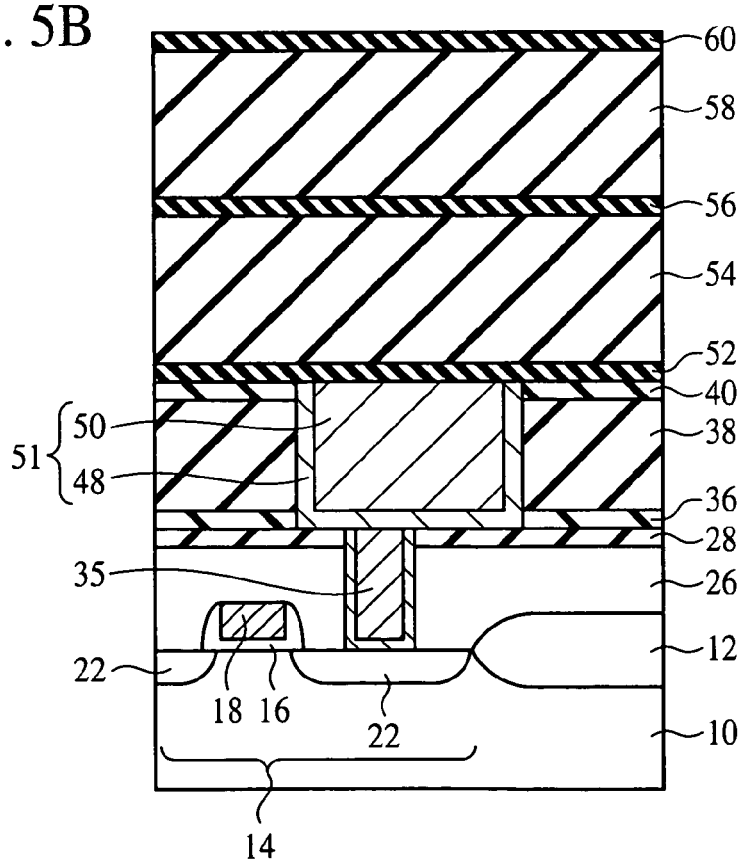

Then, on the inter-layer insulating film 58, the insulating film 60 of a silicon compound containing Si—$CH_3$ bonds by 30-90% is formed (FIG. 5B). The insulating film 60 is formed by the same process for forming the insulating film 40 described above. The film thickness of the insulating film 60 is, e.g., 30 nm.

Next, UV radiation is applied through the insulating film 60 to the inter-layer insulating film 58 to UV cure the inter-layer insulating film 58. The UV cure is for increasing the film strength of the porous inter-layer insulating film 58 and increasing the film density of the insulating film 60. The UV cure is made in the same way as in UV curing the inter-layer insulating film 38 described above.

Next, a photoresist film 62 having an opening 64 exposing the region for a via hole down to the interconnection 52 to be formed in is formed on the insulating film 60 by photolithography.

Figure 6:
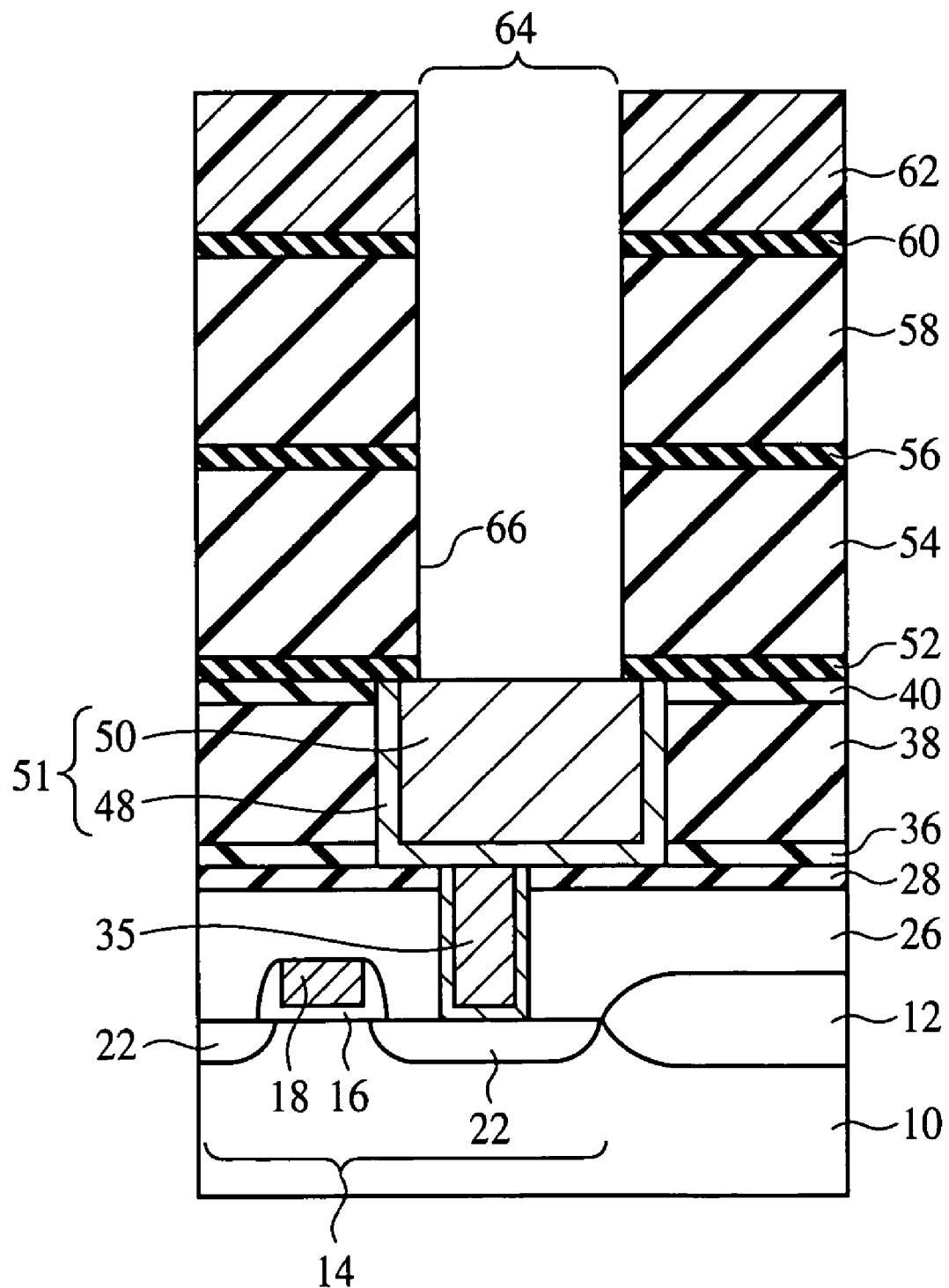

Next, by dry etching using, e.g., $CF_4$ gas and $CHF_3$ gas and with the photoresist film 62 as the mask, the insulating film 60, the inter-layer insulating film 58, the insulating film 56, the inter-layer insulating film 54 and the insulating film 52 are sequentially etched to form the via hole 66 down to the insulating film 60, the inter-layer insulating film 58, the insulating film 56, the inter-layer insulating film 54 and the insulating film 52 (FIG. 6). The respective insulating films can be sequentially etched by the composition ratio of the etching gases, and the pressure, etc. for the etching.

Next, the photoresist film 62 is removed by, e.g., ashing.

Next, on the insulating film 60 with the via hole 66 formed in, a photoresist film 68 with the opening 70 exposing the region for the interconnection 77b of the second layer to be formed in is formed by photolithography.

Figure 7:
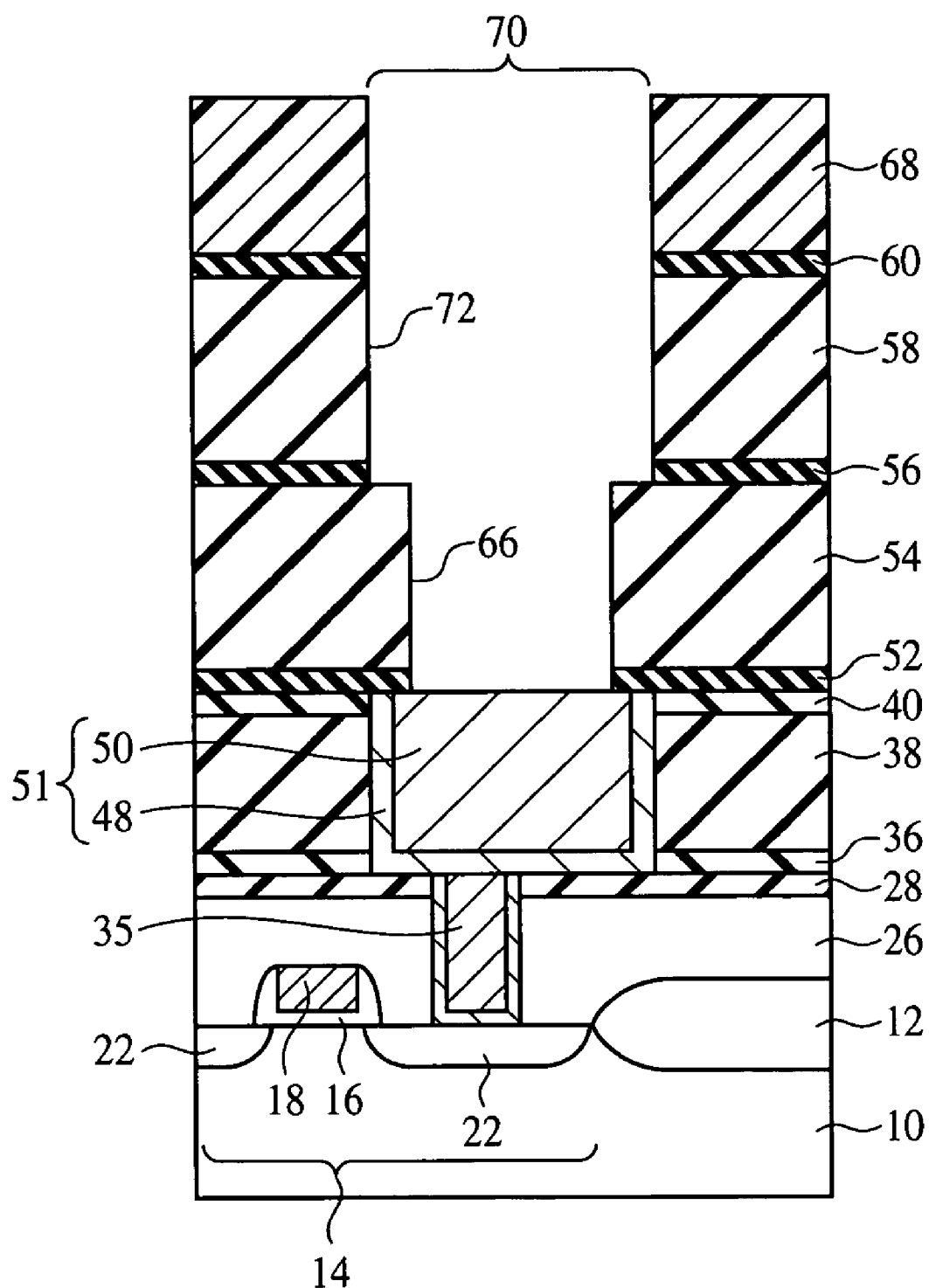

Next, by dry etching using, e.g., $CF_4$ gas and $CHF_3$ gas and with the photoresist film 68 as the mask, the insulating film 60, the inter-layer insulating film 58 and the insulating film 56 are sequentially etched to form the interconnection trench 72 for burying the interconnection 77b in the insulating film 60, the inter-layer insulating film 58 and the insulating film 56 (FIG. 7). The interconnection trench 72 is connected to the via hole 66.

Then, the photoresist film 68 is removed by, e.g., ashing.

Next, a TaN film of, e.g., a 10 nm-thickness is deposited on the entire surface by, e.g., sputtering method to form the barrier metal 74 of the TaN film. The barrier metal 74 is for preventing the diffusion of the Cu from a copper interconnection to be formed in a later step into the insulating film.

Next, on the barrier metal 74, a Cu film of, e.g., a 10 nm-thickness is deposited by, e.g., sputtering method to form a seed film (not shown) of the Cu film.

Then, by, e.g., electroplating using the seed film as the seed, a Cu film is deposited to form the Cu film 76 of, e.g., a 1400 nm-thickness including the thickness of the seed layer.

Then, the Cu film 76 and the barrier metal 74 on the insulating film 60 are polished off by CMP method to form integral with each other at once the contact plug 77a buried in the via hole 66 and formed of the barrier metal 74 and the Cu film 76, and the interconnection 77b buried in the interconnection trench 72 and formed of the barrier metal 74 and the Cu film 76. The process for thus forming the contact plug 77a and the interconnection 77b integral with each other and at once is called dual damascene method.

Figure 8:
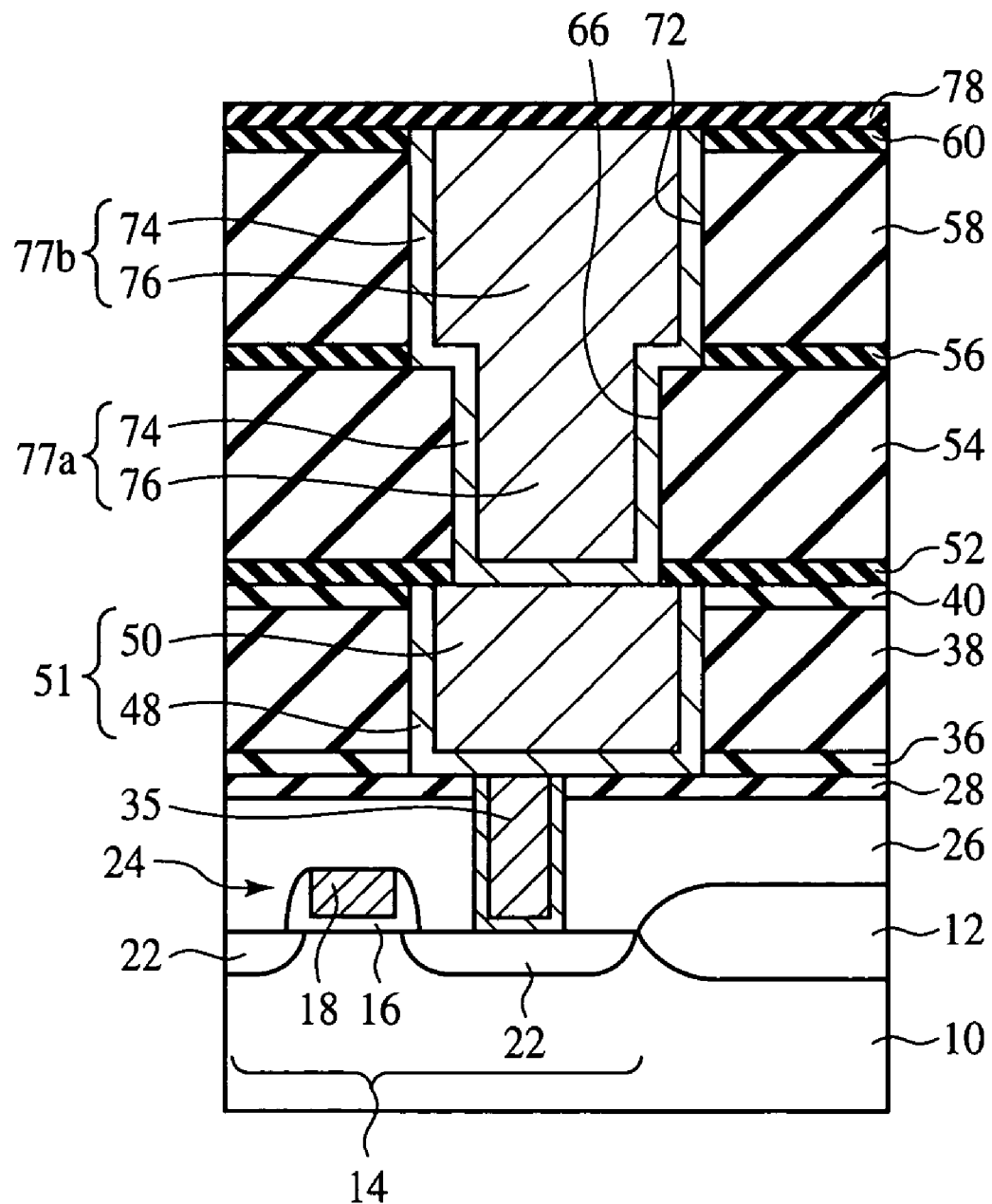

Then, an SiC hydride oxide film of, e.g., a 30 nm-thickness is deposited on the entire surface by, e.g., CVD method to form the insulating film 78 of the SiC hydride oxide film (FIG. 8). The insulating film 78 functions as the barrier film for preventing the diffusion of water and the diffusion of the Cu from the Cu interconnection.

Then, the above-described steps are suitably repeated as required to from the interconnection of the third layer (not shown), etc., and the semiconductor device according to the present embodiment is completed.

As described above, according to the present embodiment, on the porous insulating film, the insulating film of a silicon compound containing Si—$CH_3$ bonds by 30-90%, and UV radiation is irradiated through the insulating film to the porous insulating film to cure the porous insulating film, whereby the UV radiation having the wavelength which eliminates $CH_3$ groups can be sufficiently absorbed, and the strength of the porous insulating film can be advanced with priority by the UV cure. Resultantly, without increasing the dielectric constant of the porous insulating film, the film density can be increased. The adhesion to the lower film can be also increased. In the irradiation of the UV radiation, the $CH_3$ groups in the upper insulating film are eliminated, and the film density is increased, whereby the film strength is increased, and the upper insulating film can be used as the etching stopper film. Thus, a circuit substrate of higher reliability and high speed can be fabricated.

The present invention is not limited to the above-described embodiment and can cover other various modifications.

The present invention is not limited to the structure of the semiconductor device according to the above-described embodiment and the method for fabricating the semiconductor device, and is applicable widely to the fabrication of semiconductor devices including porous insulating films. The film thickness and the materials of the respective layers forming the semiconductor device can be suitably changed.

EXAMPLES

The composition for forming the insulating film of porous silica was applied to a substrate by spin coating method, and an applied film was formed. The application conditions were, e.g., 3000 rpm and 30 seconds. Then, soft bake is made to cure the applied film while thermally decomposing the heat decomposable compound contained in the composition for forming the insulating film to form pores.

Thus, the porous insulating film of porous silica was formed. The cross-linking degree of the thus formed porous insulating film was measured by infrared spectroscopy. The cross-linking degree was 10-90%. The content of Si—$CH_3$ bonds in the porous insulating film was give by XPS measurement, and the content ratio was 3-60%.

Next, on the thus formed porous insulating film, an insulating film of silicon compound containing Si—$CH_3$ bonds by a prescribed content ratio was formed by spin coating method. The content ratio of Si—$CH_3$ bonds was changed to prepare 11 kinds of samples described below. The content ratios of the Si—$CH_3$ bonds were confirmed by an XPS apparatus of "Axis-Hsi" from Kratos Analytical Limited.

Example 1

The insulating film was formed with the content ratio of Si—CH$_3$ bonds being 30%.

Example 2

The insulating film was formed with the content ratio of Si—CH$_3$ bonds being 40%.

Example 3

The insulating film was formed with the content ratio of Si—CH$_3$ bonds being 50%.

Example 4

The insulating film was formed with the content ratio of Si—CH$_3$ bonds being 60%.

Example 5

The insulating film was formed with the content ratio of Si—CH$_3$ bonds being 70%.

Example 6

The insulating film was formed with the content ratio of Si—CH$_3$ bonds being 80%.

Example 7

The insulating film was formed with the content ratio of Si—CH$_3$ bonds being 90%.

[Control 1] The insulating film was formed with the content ratio of Si—CH$_3$ bonds being 0%.

[Control 2] The insulating film was formed with the content ratio of Si—CH$_3$ bonds being 10%.

[Control 3] The insulating film was formed with the content ratio of Si—CH$_3$ bonds being 20%.

[Control 4] The insulating film was formed with the content ratio of Si—CH$_3$ bonds being 93%.

Next, UV radiation was irradiated to the porous insulating film through the insulating film to make UV cure the porous insulating film, and the samples to be measured were prepared.

The dielectric constant of the porous insulating films, the strength of the porous insulating films and the etching selectivity of the insulating film to the porous insulating films were measured on the thus prepared samples.

By the fabrication method according to the embodiment described above, the interconnections and the conductive plugs were formed to electrically serially connect 1,000,000 contact plugs, and the yield test of the electric connections was made. The effective dielectric constant between the interconnections was measured.

The effective dielectric constant is a dielectric constant measured with the porous insulating film and other insulating films being present around the interconnections. In this case, the effective dielectric constant was measured with the porous insulating film of relatively low dielectric constant and also the insulating film of relatively high dielectric constant being around the interconnections, and the values of the effective dielectric constant are larger than the dielectric constants of the porous insulating film.

The result of the measurement made on the 11 kinds of samples described above is summarized in Table 1 and TABLE 2.

TABLE 1

| | Solid Film Test | | | |
|---|---|---|---|---|
| | Si—CH$_3$ Bond Content [%] | Dielectric Constant | Strength [GPa] | Etching Selectivity to Porous Insulating Film |
| Example 1 | 30 | 2.25 | 15.2 | 1.50 |
| Example 2 | 40 | 2.23 | 14.7 | 1.52 |
| Example 3 | 50 | 2.30 | 15.1 | 1.53 |
| Example 4 | 60 | 2.26 | 15.5 | 1.53 |
| Example 5 | 70 | 2.31 | 14.7 | 1.60 |
| Example 6 | 80 | 2.27 | 15.0 | 1.70 |
| Example 7 | 90 | 2.22 | 15.0 | 1.82 |
| Control 1 | 0 | 3.00 | 18.2 | 1.22 |
| Control 2 | 10 | 2.90 | 18.0 | 1.38 |
| Control 3 | 20 | 2.90 | 17.5 | 1.43 |
| Control 4 | 93 | 2.27 | 10.0 | 1.88 |

TABLE 2

| | Interconnection Test | | |
|---|---|---|---|
| | Si—CH$_3$ Bond Content [%] | Effective Dielectric Constant | Yield [%] |
| Example 1 | 30 | 2.6 | 100 |
| Example 2 | 40 | 2.7 | 98.7 |
| Example 3 | 50 | 2.6 | 94.7 |
| Example 4 | 60 | 2.6 | 96.1 |
| Example 5 | 70 | 2.6 | 96.1 |
| Example 6 | 80 | 2.7 | 94.7 |
| Example 7 | 90 | 2.6 | 94.7 |
| Control 1 | 0 | 3.2 | 51.1 |
| Control 2 | 10 | 3.2 | 57.6 |
| Control 3 | 20 | 3.1 | 57.6 |
| Control 4 | 93 | 2.6 | 71.1 |

As shown in TABLE 1, the content ratio of Si—CH$_3$ bonds of the insulating film is set at not less than 30% including 30%, whereby the dielectric constant of the porous insulating film was decreased. This is because the content ratio of Si—CH$_3$ bonds of the upper insulating film is set at not less than 30%, whereby in the UV cure, the UV radiation having the wavelength which eliminates CH$_3$ groups is sufficiently absorbed by the upper insulating film, and only the UV radiation necessary to dehydrate and condense silanol remaining in the porous insulating film can arrive at the porous insulating film.

On the other hand, as the ratio of the eliminated CH$_3$ groups is decreased, the film strength is a little decreased. However with the content of the Si—CH$_3$ groups being 30-90%, the decrease is small. Based on that the film strength of the porous insulating film without the insulating film containing Si—CH$_3$ bonds by 30-90% is 10.0 GPa, the effect of improving the film strength can be found also in the range of 30-90% of the Si—CH$_3$ bond content ratio.

As the content of Si—CH$_3$ bonds of the insulating film was increased, the etching selectivity to the porous insulating film could be increased. With the content of the Si—CH$_3$ bonds being not less than 30%, the etching selectivity to the porous insulating film was not less than 1.5, and the practical value could be realized.

As shown in TABLE 2, based on the result of the yield of the electrical contacts, the samples whose contents of Si—CH₃ are 30-90% could have high yields of 94.7-100%, while the samples whose contents of Si—CH₃ bonds are less than 30% or more than 90% so low as 51.1-71.1%.

The resistance of the interconnection was measured after left at 200° C. for 3000 hours. No increase of the resistance value of the samples of Examples 1 to 7 was confirmed, but increases of the resistance value of the samples of Controls 1 to 4 were confirmed.

What is claimed is:

1. A composition for forming an insulating film comprising:
   a silicon compound containing Si—CH3 bonds by 30-90%; and
   an organic solvent for dissolving the silicon compound, wherein
   the silicon compound is a compound having parts of $R^1$, $R^2$ and $R^3$ of polysilazane expressed by the general formula:

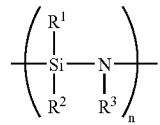

(where R1, R2 and R3 may be equal to each other or different from each other and respectively represent a hydrogen atom, a substituted or an unsubstituted alkyl group, an alkenyl group, a cycloalkyl group or an aryl group.) substituted with CH3 to thereby control the content ratio of the Si-CH3 bonds to be in the above-described range.

* * * * *